US009404182B2

(12) United States Patent
Agafonov et al.

(10) Patent No.: US 9,404,182 B2
(45) Date of Patent: *Aug. 2, 2016

(54) MULTI-WAFER REACTOR

(71) Applicant: Sensor Electronic Technology, Inc., Columbia, SC (US)

(72) Inventors: Igor Agafonov, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/804,401

(22) Filed: Jul. 21, 2015

(65) Prior Publication Data
US 2015/0337442 A1    Nov. 26, 2015

Related U.S. Application Data

(63) Continuation-in-part of application No. 14/060,173, filed on Oct. 22, 2013, now Pat. No. 9,087,695.

(60) Provisional application No. 61/716,675, filed on Oct. 22, 2012.

(51) Int. Cl.
*H01L 21/00* (2006.01)
*C23C 16/455* (2006.01)
(Continued)

(52) U.S. Cl.
CPC ....... *C23C 16/45565* (2013.01); *C23C 16/4584* (2013.01); *C23C 16/45563* (2013.01); *C23C 16/52* (2013.01); *H01L 22/26* (2013.01); *H01L 21/0254* (2013.01); *H01L 21/0262* (2013.01); *H01L 22/12* (2013.01)

(58) Field of Classification Search
CPC ............ H01L 21/062; H01L 21/02107; C23C 16/45565
USPC ....................................... 438/5; 118/712, 730
See application file for complete search history.

(56) References Cited

U.S. PATENT DOCUMENTS 5,264,040 A    11/1993 Geyling
6,200,389 B1    3/2001 Miller et al.
(Continued)

OTHER PUBLICATIONS

Tran, Long K., U.S. Appl. No. 14/060,173, Notice of Allowance, Mar. 17, 2015, 16 pages.
(Continued)

*Primary Examiner* — Long K Tran
(74) *Attorney, Agent, or Firm* — LaBatt, LLC

(57) ABSTRACT

A solution for manufacturing semiconductors is provided. An embodiment provides a chemical vapor deposition reactor, which includes a chemical vapor deposition chamber. A substrate holder located in the chemical vapor deposition chamber can be rotated about its own axis at a first angular speed, and a gas injection component located in the chemical vapor deposition chamber can be rotated about an axis of the gas injection component at a second angular speed. The angular speeds are independently selectable and can be configured to cause each point on a surface of a substrate wafer to travel in an epicyclical trajectory within a gas flow injected by the gas injection component. An angle between the substrate holder axis and the gas injection component axis and/or a distance between the substrate holder axis and the gas injection component axis can be controlled variables.

20 Claims, 9 Drawing Sheets

(51) Int. Cl.
*C23C 16/458* (2006.01)
*C23C 16/52* (2006.01)
*H01L 21/02* (2006.01)
*H01L 21/66* (2006.01)

(56) References Cited

U.S. PATENT DOCUMENTS

| | | |
|---|---|---|
| 6,812,157 B1 | 11/2004 | Gadgil |
| 7,192,849 B2 | 3/2007 | Fareed et al. |
| 8,092,599 B2 | 1/2012 | Sferlazzo et al. |
| 8,152,923 B2 | 4/2012 | Mitrovic et al. |
| 2008/0102199 A1 | 5/2008 | Gurary |
| 2009/0017190 A1* | 1/2009 | Sferlazzo .......... C23C 16/45589 427/10 |
| 2011/0300297 A1 | 12/2011 | Celaru et al. |
| 2013/0105298 A1* | 5/2013 | Tsunekawa ......... C23C 14/3464 204/192.13 |

OTHER PUBLICATIONS

Amano, H., Akasaki, I.: Novel aspects of the growth of nitrides by MOVPE. Journal of Physics: Condensed Matter 13:6935-6944 (2001).

Aumer, M.E., Leboeuf, S.F., McIntosh, F.G., Bedair, S.M.: High optical quality AlInGaN by metalorganic chemical vapor deposition. Applied Physics Letters 75:3315 (1999).

Gotoh, H., Suga, T., Suzuki, H., Kimata, M.: Low Temperature Growth of Gallium Nitride. Japanese Journal of Applied Physics 20:L545-L548 (1981).

* cited by examiner

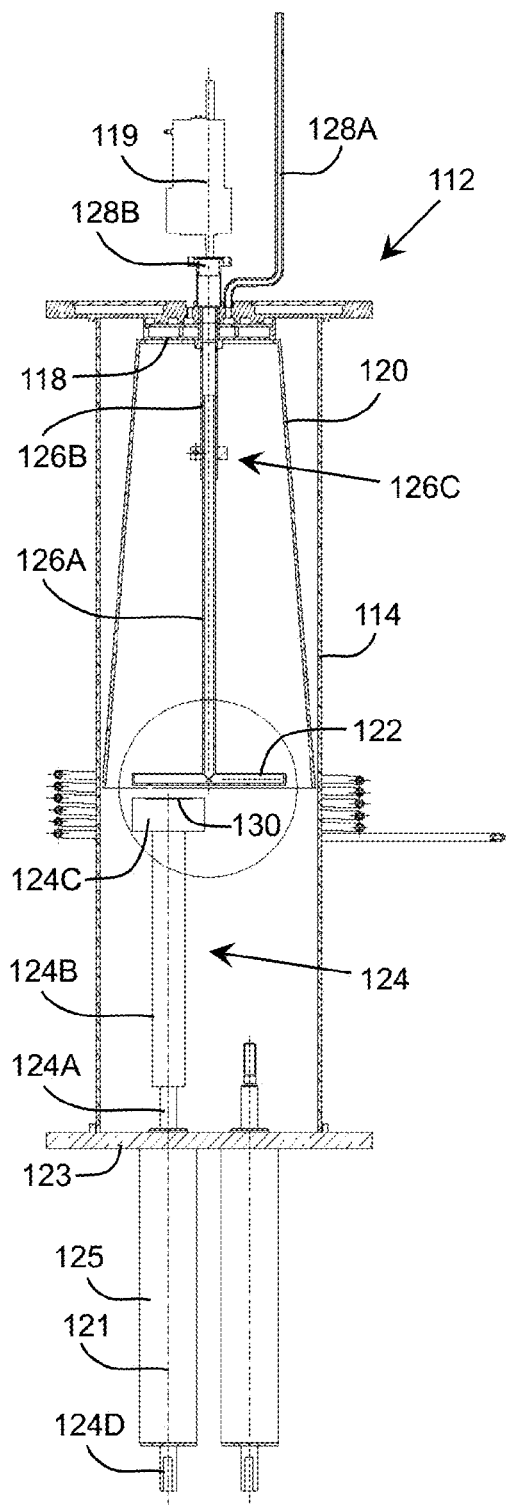
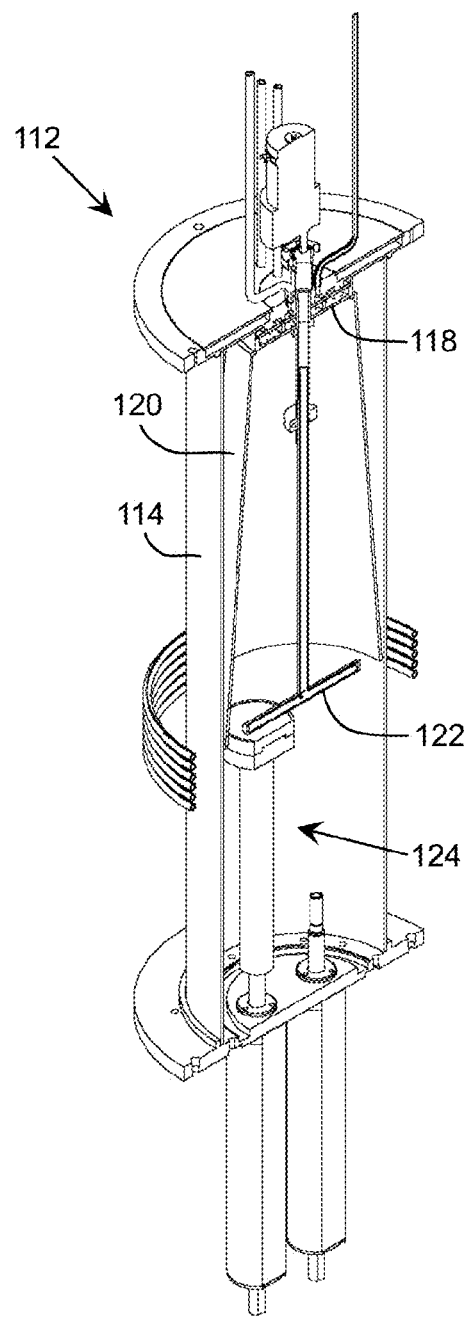
FIG. 5A
FIG. 5B

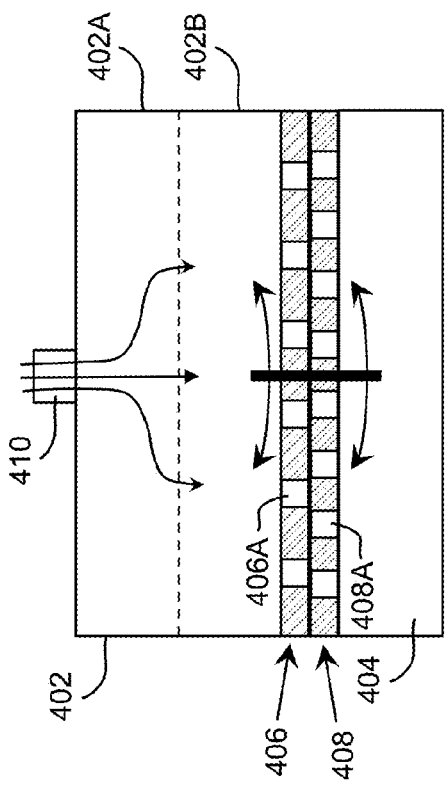
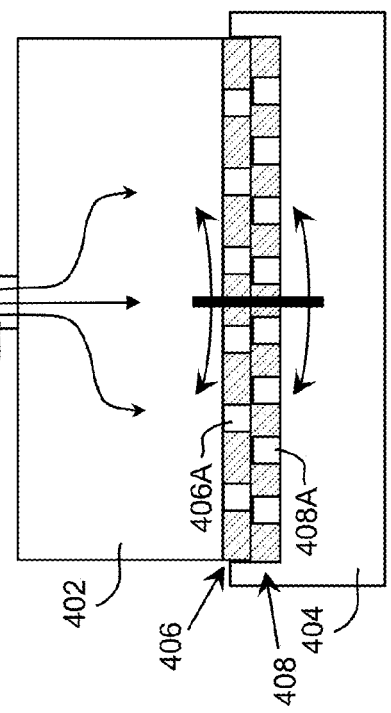
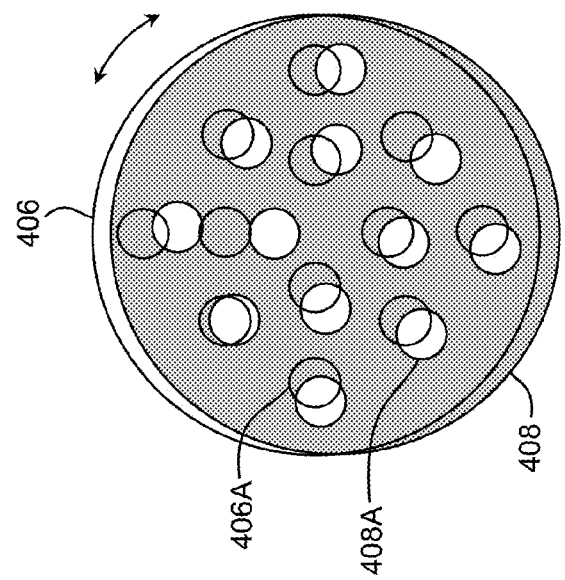

MULTI-WAFER REACTOR

REFERENCE TO RELATED APPLICATIONS

The current application is a continuation-in-part of U.S. patent application Ser. No. 14/060,173, which was filed on 22 Oct. 2013, and which claims the benefit of U.S. Provisional Application No. 61/716,675, which was filed on 22 Oct. 2012, each of which is hereby incorporated by reference.

TECHNICAL FIELD

The disclosure relates generally to a reactor, and more particularly, to a reactor including independently rotatable components.

BACKGROUND ART

Typically, nitride-based films and heterostructures are grown using Metal Organic Chemical Vapor Deposition (MOCVD), Molecular Beam Epitaxy (MBE), or Reactive Molecular-Beam Epitaxy (RMBE).

Chemical vapor deposition reactors permit the treatment of substrates, such as wafers mounted on a wafer carrier inside a reaction chamber. FIG. 1 shows an illustrative chemical vapor deposition reactor according to the prior art. As illustrated, a gas distribution injector or injector head 2 is mounted facing towards the wafer carrier 4. The injector 2 typically includes a plurality of gas inlets that provide some combination of gases to the chamber for chemical vapor deposition. Some gas distribution injectors provide a shroud, or carrier gas, that assists in providing a laminar gas flow during the chemical vapor deposition process, where the carrier gas typically does not participate in chemical vapor deposition. Many gas distribution injectors have showerhead designs, in which gas inlets are spaced in a pattern on the head.

A gas distribution injector 2 typically permits precursor gases to be directed from gas inlets on an injector surface towards certain targeted regions of the reaction chamber, where wafers can be treated for processes such as epitaxial growth of material layers. Ideally, the precursor gases are directed at the wafer carrier in such a way that the precursor gases react on the wafer or as close to the wafers as possible, thus maximizing reaction processes and epitaxial growth on the wafer surface.

In many metal organic chemical vapor deposition (MOCVD) processes, for example, combinations of precursor gases comprised of metal organics and hydrides, such as ammonia or arsine, are introduced into a reaction chamber through the injector. Process-facilitating carrier gases, such as hydrogen, nitrogen, or inert gases, such as argon or helium, also may be introduced into the reactor through the injector. The precursor gases mix in the reaction chamber and react to form a deposit on a wafer held within the chamber. The carrier gases typically aid in maintaining laminar flow at the wafer carrier.

Many existing gas injector systems have problems associated with uniform deposition and subsequent uniform epitaxial growth of semiconductor layers. For example, precursor injection patterns in existing gas distribution injector systems may contain regions with low gas circulation, whereas other areas may contain recirculation patterns. In addition, some reaction may happen at the injector walls resulting in unwanted deposition. Such deposition consumes reactants and decreases the efficiency and reproducibility of the process. Moreover, reaction products deposited on the injector or on the reactor wall can be dislodged and can contaminate the substrates.

In a chemical vapor deposition system, uniform deposition on wafer surfaces is of prime importance. In a typical chemical vapor deposition system, one or more wafers may be heated by placing it on a susceptor, and reaction gases are provided into the reaction chamber via gas injection system to initiate the growth of layers on the wafers.

Considerable effort has been devoted in the art to achieve uniform reaction conditions over the entire extent of the wafer carrier to assure that the deposited layers grow uniformly on all of the wafers. Another desire is to assure that the process gases supplied to all regions of the reactor are used efficiently and are not wasted.

Chemical vapor deposition systems in which the wafer carrier is rotated tend to increase deposition uniformity. To this extent, one approach to improve gas circulation in the reaction chamber uses Vertical Rotating Disc Reactors (RDRs), which are widely used for the large-scale production of gallium nitride (GaN)-based semiconductor devices, such as blue and green light-emitting diodes (LEDs), ultraviolet LEDs, solid-state lasers, and heterojunction bipolar transistors. In RDRs, rotation of the wafer carrier results in an effective averaging of the deposition rate distribution, which is a key mechanism providing growth of epitaxial layers with highly uniform properties. FIGS. 2A and 2B show the schematics and gas flow field, respectively, of a reactor chamber including a rotating disk holder according to the prior art.

In addition to the RDRs, approaches have also sought to optimize the shower heads contained in the injector to improve overall uniformity of gas deposition and stability of the flow above the rotating wafer carriers. Furthermore, for systems with wafer carriers holding multiple wafers, the systems have been implemented to rotate the entire wafer carrier set at a first rate, while spinning the individual wafer carriers around themselves at a second rate, thus creating planetary motion of the wafers. FIG. 3 shows a schematic of a system of rotating disk holders undergoing planetary motion according to the prior art. Typically, the wafer planetary motion system is achieved through a set of gears. Mechanical stress in the gear system, together with thermal stress due to high operational temperatures of the reaction chamber, adds to the mechanical stress in the mechanism and results in lower reliability and higher pollution of the reaction chamber through particle contamination coming from the gear system.

Another approach seeks to improve the reaction chamber by, in addition to having rotating wafer plates, injecting the gas through a movable injector device in a radial direction towards or away from the axis of rotation. The approach may further include the step of discharging a second gas with a component of motion in the downstream direction toward the substrates. Numerous factors, including the flux of first gas through the first movable gas inlet and the speed of motion of the first movable gas inlet, are allowed to be controlled so as to control the rate of reaction as, for example, the rate of deposition in a chemical vapor deposition reaction, as well as the composition of the deposited material. In addition, the approach also describes a gas injector head wherein the injector head includes a body having a central axis, the body being arranged for mounting to the reactor with the central axis aligned with the axis of rotation of the wafer carrier in the reactor, and with the head facing in a downstream direction.

SUMMARY OF THE INVENTION

Aspects of the invention provide a solution for manufacturing semiconductors. An embodiment provides a chemical vapor deposition reactor, which includes a chemical vapor deposition chamber. A substrate holder located in the chemical vapor deposition chamber can be rotated about its own axis at a first angular speed, and a gas injection component located in the chemical vapor deposition chamber can be rotated about an axis of the gas injection component at a second angular speed. The angular speeds are independently selectable and can be configured to cause each point on a surface of a substrate wafer to travel in an epicyclical trajectory within a gas flow injected by the gas injection component. An angle between the substrate holder axis and the gas injection component axis and/or a distance between the substrate holder axis and the gas injection component axis can be controlled variables.

A first aspect of the invention provides a system comprising: a chemical vapor deposition reactor including: a chemical vapor deposition chamber; a set of substrate holders located in the chemical vapor deposition chamber, wherein a substrate holder in the set of substrate holders is configured to be rotated about an axis of the substrate holder at a first angular speed; and a set of gas injection components located in the chemical vapor deposition chamber, wherein a gas injection component in the set of gas injection components is configured to be rotated about an axis of the gas injection component at a second angular speed, wherein the first angular speed and the second angular speed are independently selectable.

A second aspect of the invention provides a system comprising: a chemical vapor deposition reactor including: a chemical vapor deposition chamber; a plurality of substrate holders located in the chemical vapor deposition chamber, wherein a substrate holder in the plurality of substrate holders is configured to be rotated about an axis of the substrate holder at a first angular speed; and a set of gas injection components located in the chemical vapor deposition chamber, wherein a gas injection component in the set of gas injection components is configured to be rotated about an axis of the gas injection component at a second angular speed, wherein the first angular speed and the second angular speed are independently selectable; and a control system, wherein the control system is configured to cause the substrate holder to rotate at the first angular speed and the gas injection component to rotate at the second angular speed.

A third aspect of the invention provides a method comprising: growing a layer on a surface of a substrate wafer in a chemical vapor deposition chamber, wherein the growing includes: rotating, by a control system, a substrate holder on which the substrate wafer is attached about an axis of the substrate holder at a first angular speed; and rotating, by the control system, a gas injection component located in the chemical vapor deposition chamber about an axis of the gas injection component at a second angular speed, wherein the first angular speed and the second angular speed are independently selected.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 5A-5C show schematics of an illustrative CVD reactor according to an embodiment.

FIGS. 7A-7B show schematics of illustrative CVD systems according to embodiments.

FIGS. 8A-8C show illustrative configurations of separately rotatable structures according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Aspects of the invention provide a solution for manufacturing semiconductors, e.g., by epitaxial growth of semiconductor layer(s) on a substrate wafer. For example, an embodiment provides a system including a chemical vapor deposition (CVD) reactor, which can be operated to provide an improved distribution of reactive gases over the substrate wafer for epitaxial semiconductor film growth. The CVD reactor can be configured to enable the substrate wafer and/or one or more gas injection components to be rotated during the growth. Additional features, such as enabling the substrate wafer to be tilted with respect to a flow of the gases, also can be included in the CVD reactor.

As indicated above, aspects of the invention provide a solution for manufacturing semiconductors. An embodiment provides a chemical vapor deposition reactor, which includes a chemical vapor deposition chamber. A substrate holder located in the chemical vapor deposition chamber can be rotated about its own axis at a first angular speed, and a gas injection component located in the chemical vapor deposition chamber can be rotated about an axis of the gas injection component at a second angular speed. The angular speeds are independently selectable and can be configured to cause each point on a surface of a substrate wafer to travel in an epicyclical trajectory within a gas flow injected by the gas injection component. An angle between the substrate holder axis and the gas injection component axis and/or a distance between the substrate holder axis and the gas injection component axis can be controlled variables. As used herein, unless otherwise noted, the term "set" means one or more (i.e., at least one) and the phrase "any solution" means any now known or later developed solution.

Figure 1:
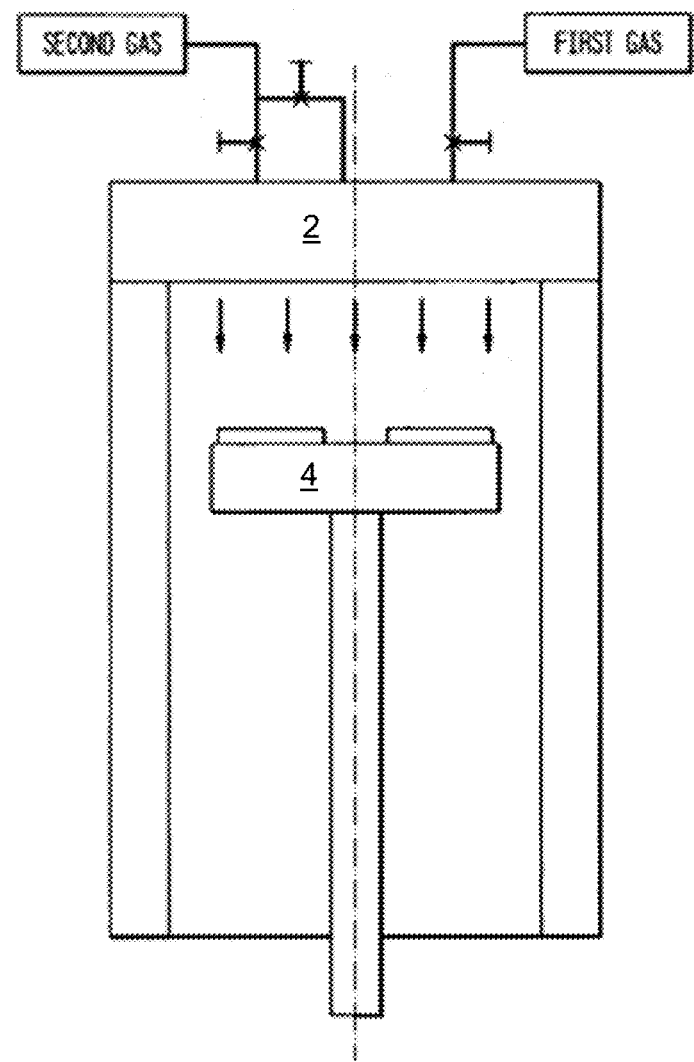
FIG. 1 shows an illustrative chemical vapor deposition (CVD) reactor according to the prior art.
Figure 2B:
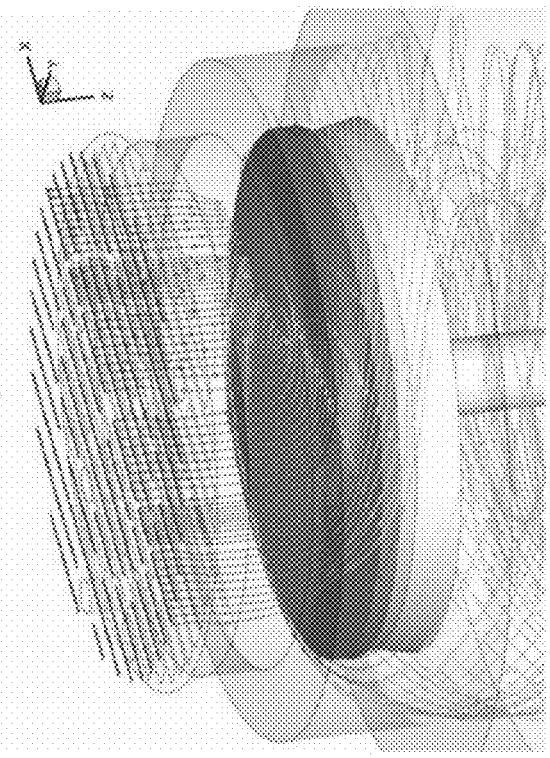
FIGS. 2A and 2B show the schematics and gas flow field, respectively, of a reactor chamber including a rotating disk holder according to the prior art.
Figure 2A:
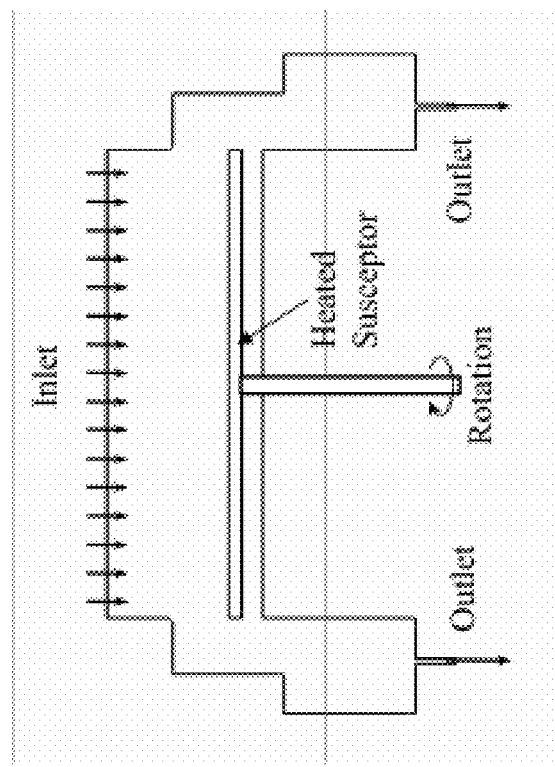
Figure 3:
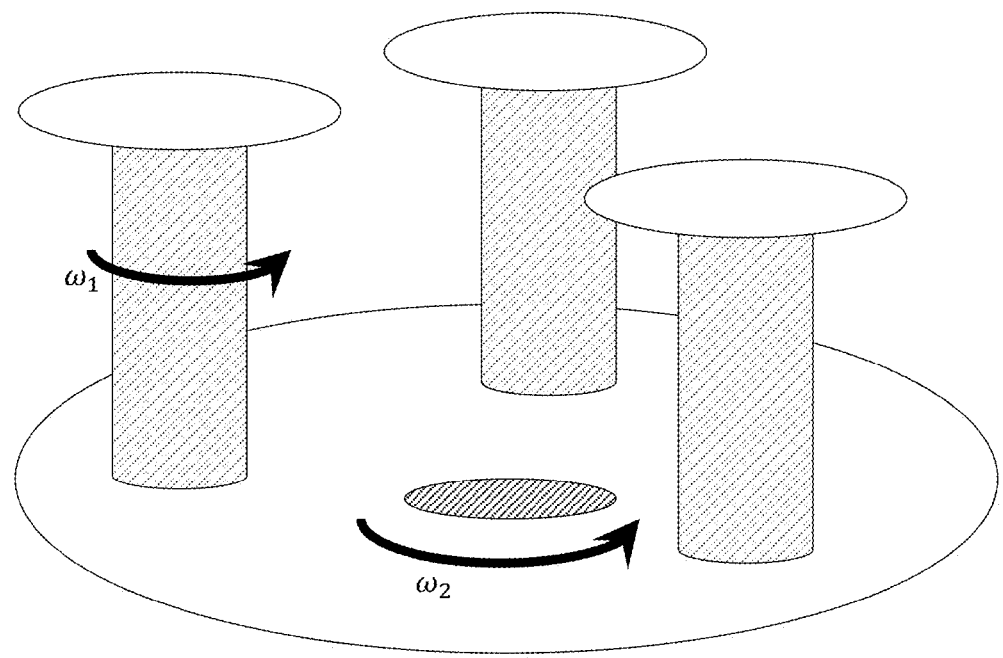
FIG. 3 shows a schematic of a system of rotating disk holders undergoing planetary motion according to the prior art.
Figure 4:
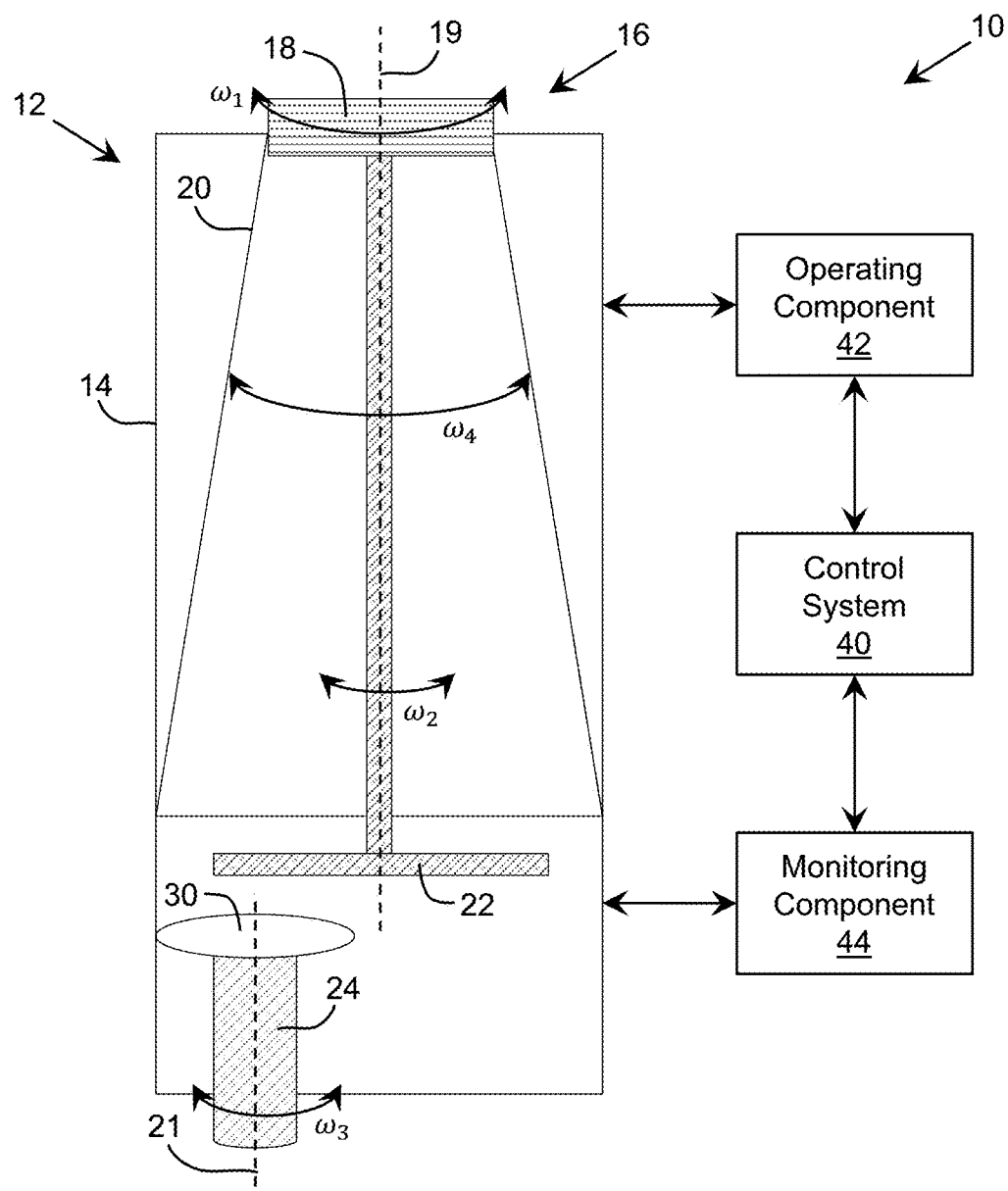
FIG. 4 shows a schematic of an illustrative CVD system according to an embodiment.

Turning to the drawings, FIG. 4 shows a schematic of an illustrative chemical vapor deposition (CVD) system 10 according to an embodiment. The system 10 includes a CVD reactor 12 including a CVD chamber 14. The CVD reactor 12 includes a first gas injection component 16, which includes a showerhead 18 located in a top portion of the CVD chamber 14 and a bell unit 20 to facilitate gas mixing and propagation within the CVD chamber 14. Additionally, the CVD reactor 12 includes a second gas injection component 22 located in the CVD chamber 14 below the bell unit 20. The gas injection components 16, 22 can be configured to deliver one or more precursor gases in a downstream direction toward a substrate wafer 30 located on a substrate holder 24 for epitaxial semiconductor film growth on the substrate wafer 30. To this extent, each gas injection component 16, 22 can discharge an individual gas or a mixture of two or more gases from a set of gas inlets fluidly connected thereto.

The CVD chamber 14 can be configured to withstand high temperatures, e.g., by proper water cooling. For example, typical growth temperatures can be within a range of 300 to 1400 degrees Celsius. The CVD chamber 14 also can have an interior surface which does not react with the chemicals being used. Illustrative chamber walls can be formed of quartz or ceramics. To prevent overheating of the CVD reactor 12, injector head(s) 18, 22 and/or walls of CVD chamber 14 can contain channels (e.g., quartz tubing) for cooling using flowing media such as, for example, cooled nitrogen gas. A wafer 30 can sit on a surface of the substrate holder 24, which can be configured to maintain the wafer 30 at a controlled temperature, e.g., in a range of 300 to 1400 degrees Celsius. A pressure and/or temperature within the CVD chamber 14 also can be controlled via pressure and/or temperature control components known in the art.

Formation of an epitaxial layer occurs by a change to the constituent chemicals on the surface of the substrate wafer 30 caused by heat (pyrolysis). This growth process is commonly used in the manufacture of laser diodes, solar cells, light emitting diodes, and other semiconductor devices. A carrier gas, such as nitrogen ($N_2$) or hydrogen ($H_2$), can be bubbled through a metalorganic liquid, and the carrier gas can pick up metalorganic vapor, which can be transported into the CVD chamber 14. A temperature of the metalorganic liquid and carrier gas as well as the flow rate into the CVD chamber 14 affect an amount of metalorganic vapor that is transported. The CVD system 10 can be configured to collect exhaust gas from the CVD chamber 14 and process the exhaust gas to minimize pollution.

One or more components of the CVD reactor 12 can rotate about a corresponding axis. Additionally, such rotation(s) can be independent from the rotation of one or more of the other rotatable components. For example, the showerhead 18 can be configured to rotate about an axis 19 at an angular speed $\omega_1$, the second gas injection component 22 can be configured to rotate about the axis 19 at an angular speed $\omega_2$, the substrate holder 24 can be configured to rotate about an axis 21 at an angular speed $\omega_3$, the bell unit 20 can be configured to rotate about the axis 19 at an angular speed $\omega_4$, and/or the like. While each component is shown and described as rotating about an axis, one or more components, such as the substrate holder 24, can be rotated off-axis. In an embodiment, each angular speed $\omega_1$, $\omega_2$, $\omega_3$, $\omega_4$ can be independently set from the other angular speeds. Additionally, a rotatable component 18, 20, 22, 24 can be configured to selectively rotate in either direction (clockwise or counterclockwise) or only a single direction. In either case, during operation of the CVD reactor 12, a rotatable component 18, 20, 22, 24 can be rotating in an opposite direction from one or more of the other rotatable components 18, 20, 22, 24. Additionally, the angular speed $\omega_1$, $\omega_2$, $\omega_3$, $\omega_4$ of a rotatable component 18, 20, 22, 24 can be pulsed, accelerated or decelerated, fixed, and/or the like, during a growth cycle. For example, the angular speed $\omega_1$, $\omega_2$, $\omega_3$, $\omega_4$ of a rotatable component 18, 20, 22, 24 can be adjusted to deliver a pulsating rotational torque to the corresponding rotatable component 18, 20, 22, 24. As illustrated, the rotatable components 18, 20, 22 can each rotate about the same axis 19, e.g., a central axis of the gas injection components 16, 22, while the rotatable component 24 can rotate about its own axis 21, which can be offset from the axis 19.

Independent control of the angular speeds $\omega_1$, $\omega_2$, $\omega_3$, $\omega_4$ and/or rotational directions can enable use of a favorable ratio between these speeds for good deposition uniformity. In an embodiment, the angular speeds $\omega_1$, $\omega_2$, $\omega_3$, $\omega_4$ and rotation directions are configured to cause each point on a surface of the substrate wafer 30 to travel in an epicyclical trajectory and/or a linear oscillatory motion within the gas flow. The epicyclical trajectory corresponds to a plane curve produced by tracing the path of a chosen point of a rolling circle which rolls without slipping around a fixed circle (e.g., planetary motion). The linear oscillatory motion can comprise, for example, sinusoidal motion along a straight line in a vertical direction. In general, the motion can be any reciprocating motion along a vertical direction. Using this configuration, the CVD system 10 can provide good deposition uniformity on the surface of the substrate wafer 30 through the epicyclical trajectory movement of the substrate wafer 30 without requiring use of a complicated system of gears for planetary motion of wafers as used in the prior art. Additionally, the CVD reactor 12 can have an improved overall reliability as compared to prior art reactors configured to provide deposition uniformity, e.g., by placing a powertrain for each substrate holder 24 outside of the CVD chamber 14 where it can be maintained at room temperature, thereby not experiencing thermal stresses. Furthermore, by locating the powertrain and rotating mechanism outside of the CVD chamber 14, generation of contaminated particles to the reaction area (e.g., the surface of the substrate wafer 30) can be substantially reduced.

Figure 5C:
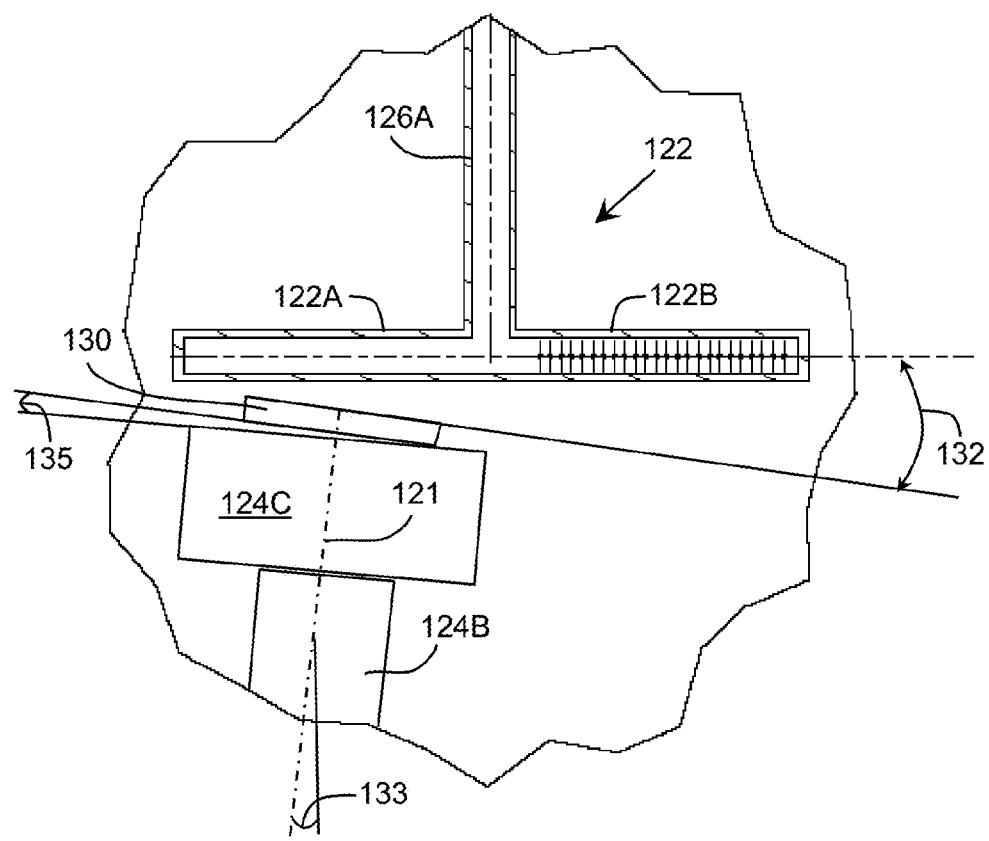

FIGS. 5A-5C show schematics of an illustrative CVD reactor 112 according to an embodiment. As illustrated, the CVD reactor 112 includes CVD chamber 114 within which are located a showerhead 118, a bell unit 120, a second gas injection component 122, and a substrate holder 124, each of which can be configured to be rotatable at an independently selected angular velocity and/or rotational direction as described herein. Additionally, it is understood that the CVD reactor 112 can be configured with multiple substrate holders 124 capable of being utilized concurrently. In this case, when multiple substrate holders 124 include substrate wafers 130 mounted therein, each substrate holder 124 can be operated independent of the other substrate holder(s) 124. To this extent, each substrate holder 124 can rotate at an angular speed and/or rotational direction, which is independently selected.

The substrate holder 124 can comprise a rotatable spindle 124A, a subholder 124B attached to the rotatable spindle 124A, and a susceptor 124C attached to the subholder 124B. A powertrain 125 can be located outside of the CVD chamber 114 and operate to rotate the rotatable spindle 124A at a selected angular speed $\omega_3$ (FIG. 4). During operation of the substrate holder 124, the rotatable spindle 124A can deliver a rotational force at the selected angular speed $\omega_3$ and/or rotational direction. The subholder 124B and susceptor 124C can be mounted in such a manner that they rotate with the rotatable spindle 124A thereby causing a substrate wafer 130 mounted on the susceptor 124C to also rotate. The substrate wafer 130 can be mounted and held onto the susceptor 124C using any solution, e.g., using a vacuum suction applied to the backside of the substrate wafer 130.

During the rotation of the substrate holder 124, a surface of the substrate wafer 130 can be maintained at a prescribed angle to the showerhead 118 and/or second gas injection component 122. For example, a top surface of the substrate wafer 130 can remain substantially normal to the flow of gas leaving the showerhead 118 and/or second gas injection component 122. In an embodiment, as shown in FIG. 5C, the substrate holder 124 is configured to allow the substrate wafer 130 to be tilted at a desired angle 132 with respect to an upstream direction of the gas flow. For example, the substrate holder 124 can be configured to tilt at an angle 133 corresponding to the desired tilt angle 132 between the substrate wafer 130 and a normal to the gas flow (as shown in conjunction with the second gas injection component 122). Furthermore, the substrate wafer 130 can be located on the substrate holder 124 at a tilt angle 135 between the surface of the substrate wafer 130 and a normal to the substrate holder axis 121. In an embodiment, each tilt angle 133, 135 is separately selectable and settable prior to and/or during rotation of the substrate holder 124. In an embodiment, a tilt angle 133, 135 can be adjusted in a range of +/−a few degrees (e.g., three) from normal.

Each tilt angle 133, 135 can be achieved using any solution. For example, the tilt angle 133 can be achieved using a ball joint swivel bearing design between the powertrain 125 and the substrate holder 124, which enables the substrate holder 124 to tilt at a desired angle 133. The tilt angle 135 can be achieved by tilting the susceptor 124C with respect to the subholder 124B, e.g., using a hinged attachment or the like. However, it is understood that these are only illustrative of various approaches for achieving tilt angles 133, 135. A desired tilt angle 132 can be achieved using either of the tilt angles 133, 135 or a combination thereof (e.g., the tilt angle 132 is a sum of the tilt angles 133, 135). Furthermore, while the tilt angles 133, 135 are shown as being additive to the overall tilt angle 132, it is understood that a tilt angle 133, 135 could be configured to oppose the other tilt angle 133, 135. By tilting the substrate wafer 130 with respect to the gas flow, a deposition rate on the surface of the substrate wafer 130 can be affected (e.g., increased) due to the orientation of the substrate wafer 130 surface towards the tangential gas flow. Furthermore, a rotating motion of the substrate wafer 130 can be affected by tilting the substrate wafer 130 with respect to a normal of the substrate holder axis 121 (e.g., tilt angle 135). This enables the growth rate and/or film uniformity to be controlled by changing the gas flow dynamics.

In an embodiment, a vertical distance, shown in FIGS. 5A and 5B, between the substrate wafer 130 and the showerhead 118 and/or the second gas injection component 122 can be adjusted. For example, the substrate holder 124 can be configured to move the susceptor 124C in a vertical direction with respect to the showerhead 118 and second gas injection component 122. The vertical movement can be provided using any solution, e.g., by mechanism(s) included on the rotatable spindle 124A, the subholder 124B, and/or the susceptor 124C. For example, the substrate holder 124 can include a shaft 124D, which can extend through the rotatable spindle 124A and subholder 124B and enable vertical movement of the susceptor 124C. In an embodiment, the second gas injection component 122 can be moved in a vertical direction. For example, the second gas injection component 122 can be suspended by a first tubing 126A, which extends into a second tubing 126B and is held in place using a mechanism 126C that allows selective vertical movement of the first tubing 126A with respect to the second tubing 126B. In an embodiment, the second gas injection component 122 is moved between growth procedures. However, it is feasible to move the second gas injection component 122 in a vertical direction during the growth, if necessary. This vertical motion can create an adjustment of precursor mixing. A distance of the motion can be, for example, up to twenty inches depending on chamber design.

Furthermore, a distance between the axis 121 of the substrate holder 124 and the axis 119 of the gas injection components 122 can be variable. For example, the substrate holder 124 can be attached to the powertrain 125 through an opening in a bottom flange 123 of the CVD chamber 114. The opening can enable selective movement of the substrate holder 124 and powertrain 125 along a radial direction of the CVD chamber 114. The movement can be limited to prevent two or more substrate holders 124 from contacting one another during concurrent use of the substrate holders 124 and/or a substrate holder 124 from contacting an interior surface of the CVD chamber 114. Furthermore, the opening in the bottom flange 123 can be configured to maintain a sealed interior of the CVD chamber 114 regardless of the location of the substrate holder 124 along the opening using any solution. In an embodiment, the distance between the axis 121 of the substrate holder 124 and the axis 119 of the gas injection components 122 can be varied during a chemical vapor deposition process.

During a chemical vapor deposition process, a first precursor gas can be introduced into the CVD chamber 114 via the showerhead 118 and a second precursor gas can be introduced into the CVD chamber 114 via the second gas injection component 122. To this extent, the showerhead 118 can be fluidly connected to a first gas delivering tubing 128A through which the first precursor gas travels before exiting a plurality of openings on a bottom surface of the showerhead 118. Similarly, the second precursor gas can travel through a second gas delivering tubing 128B, which is fluidly attached to the second tubing 126B. The second precursor gas can exit the second gas injection component 122 through a plurality of perforations located thereon. The perforations can be located on one or both sides of the second gas injection component 122. In an embodiment, the second gas injection component 122 includes two semi-pipes 122A, 122B, one of which (e.g., semi-pipe 122B) includes the perforations. In this configuration, the perforations can provide rotation of the second injection component 122 by the jet propulsion of gas flow through the perforations forming micro-nozzles. Regardless, it is understood that the orientation of perforations, which can be present on one or both semi-pipes 122A, 122B, can be configured to improve jet propulsion.

Returning to FIG. 4, the CVD system 10 can further include a controller mechanism, such as a control system 40, configured to cause the CVD reactor 12 to implement a CVD growth procedure. To this extent, the control system 40 can operate one or more devices in an operational component 42 to affect a set of conditions in the CVD chamber 14 according to the CVD growth procedure. Illustrative devices in the operational component 42 include: one or more mechanisms for controlling the flow of gas through the gas injection components 16, 22; one or more mechanisms for controlling a composition of gas flowing though the gas injection components 16, 22; one or more mechanisms for controlling the rotation (angular speed and/or rotation direction) of one or more of the rotatable components 18, 20, 22, 24; mechanisms for controlling a temperature and/or pressure within the CVD chamber 14; mechanism(s) for controlling a tilt of the substrate wafer(s) 30; mechanism(s) for controlling vertical movement of the substrate wafer(s) 30 and/or the second gas injection component 22; and/or the like.

Additionally, the control system 40 can receive data regarding one or more attributes of the CVD chamber 14 and/or the substrate wafer(s) 30 during the growth process from one or more devices in a monitoring component 44. Such information can include, for example, a composition of the atmosphere; a temperature; a pressure; and/or the like. In an embodiment, the CVD system 10 is configured to perform real time monitoring of epitaxial growth on the substrate wafer(s) 30. In a more particular embodiment, the real time monitoring is performed using a set of nonintrusive data acquisition devices implemented as part of the monitoring component 44. Illustrative nonintrusive data acquisition devices include: surface-sensitive devices such as reflected high energy electron diffraction (RHEED), reflectance difference spectroscopy (RDS), surface photo absorption (SPA), laser light scattering (LLS), and/or the like; optical devices, such as kinetic reflectometry at both single and multiple wavelengths, pyrometric interferometry (PI), spectral ellipsometry (SE), and/or the like; p-polarized reflectance spectroscopy (PRS); and/or the like.

A particular configuration of the nonintrusive data acquisition devices implemented in the monitoring component 44 can be selected based on the corresponding attributes to be monitored. For example, the monitoring component can include: a surface-sensitive device to acquire data capable of providing new insights into surface chemistry and morphology of the substrate wafer(s) 30 during a growth process; an optical device to acquire data for monitoring bulk-related properties of the substrate wafer(s) 30; p-polarized reflectance optical sensor(s) to acquire data having a high sensitivity to surface chemistry, data which probes bulk material and buried interfaces, data which can enable film thickness to be controlled with sub-monolayer resolution, and/or the like.

The control system 40 can use data received from the monitoring component 44 to implement a feedback controller for dynamically affecting one or more changes to the growth environment for the substrate wafer(s) 30 during an epitaxial growth process. Illustrative changes include, for example, adjusting one or more kinetic parameters of a movable component, such as: increasing/decreasing a rotational speed of a rotatable component 18, 20, 22, 24; adjusting a tilt of a substrate wafer 30; adjusting a vertical distance between a substrate wafer 30 and the second gas injection component 22; and/or the like. Additionally, the changes can include altering one or more attributes of the growth environment and/or growth process, such as: adjusting a pressure; adjusting a temperature; reducing/increasing a preconfigured time for an operation; and/or the like.

In an illustrative embodiment, the monitoring component 44 includes a set of p-polarized reflectance optical sensors, which can provide monitoring data for processing by the control system 40. The control system 40 can process the monitoring data using an algorithm for dynamically calculating one or more settings including: rotational speeds $\omega_1$, $\omega_2$, $\omega_3$, $\omega_4$, a tilt parameter for a substrate wafer 30, a height coordinate for a substrate wafer 30, and/or the like. The control system 40 can use the calculated setting(s) to adjust one or more devices in the operational component 42 to implement the changes in the CVD reactor 12. For example, when the monitoring data indicates a small growth rate on a surface of a substrate wafer 30, the control system 40 can operate a device in the operational component 42 to increase a tilt parameter for the substrate wafer 30 in order to increase a gas flow impinging on the substrate wafer 30. Similarly, to increase a uniformity of growth on a surface of a substrate wafer 30, the control system 40 can operate a device in the operational component 42 to adjust a rotational rate of the showerhead 18 and/or the second gas injection component 22.

Figure 6:
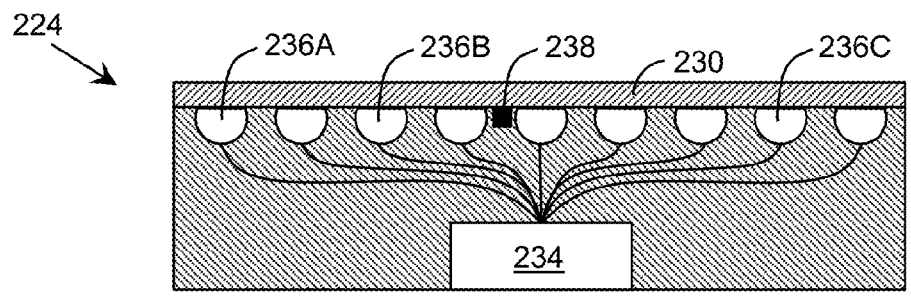
FIG. 6 shows a top portion of an illustrative substrate holder according to an embodiment.

In an embodiment, the rotational speeds $\omega_1$, $\omega_3$, can be as high as approximately one thousand revolutions per minute. To achieve such a high revolution rate, the substrate holder 24 can include a reliable mechanism for holding the substrate wafer 30 on the substrate holder 24 as it is rotating. In an embodiment, the substrate holder 24 uses vacuum suction to maintain the substrate wafer 30 tightly on top of the substrate holder 24. For example, FIG. 6 shows a top portion of an illustrative substrate holder 224 according to an embodiment. The substrate holder 224 includes a top surface including a set of cavities 236A-236C. The cavities 236A-236C are fluidly connected to a pump 234. After a substrate wafer 230 is placed on the top surface, the pump 234 can be operated (e.g., by the control system 40 (FIG. 4) to create a low pressure area in each of the cavities 236A-236C, which are adjacent to a back of the substrate wafer 230 and provide an amount of suction required to maintain the wafer substrate 230 on the substrate holder 224 as the structure is rotated. An amount of depressurization required depends on the pressure within the CVD chamber 14 (FIG. 4), the rotational speed of the substrate holder 224 (e.g., higher pressure for higher rotational speeds), and/or the like. The amount of depressurization can be selected to maintain a target pressure on the surface of the substrate holder 224. To this extent, the substrate holder 224 can include a pressure sensor 238, which can provide pressure data for processing by the control system 40 to enable the control system 40 to maintain the target pressure.

Figures 7A, 7B:
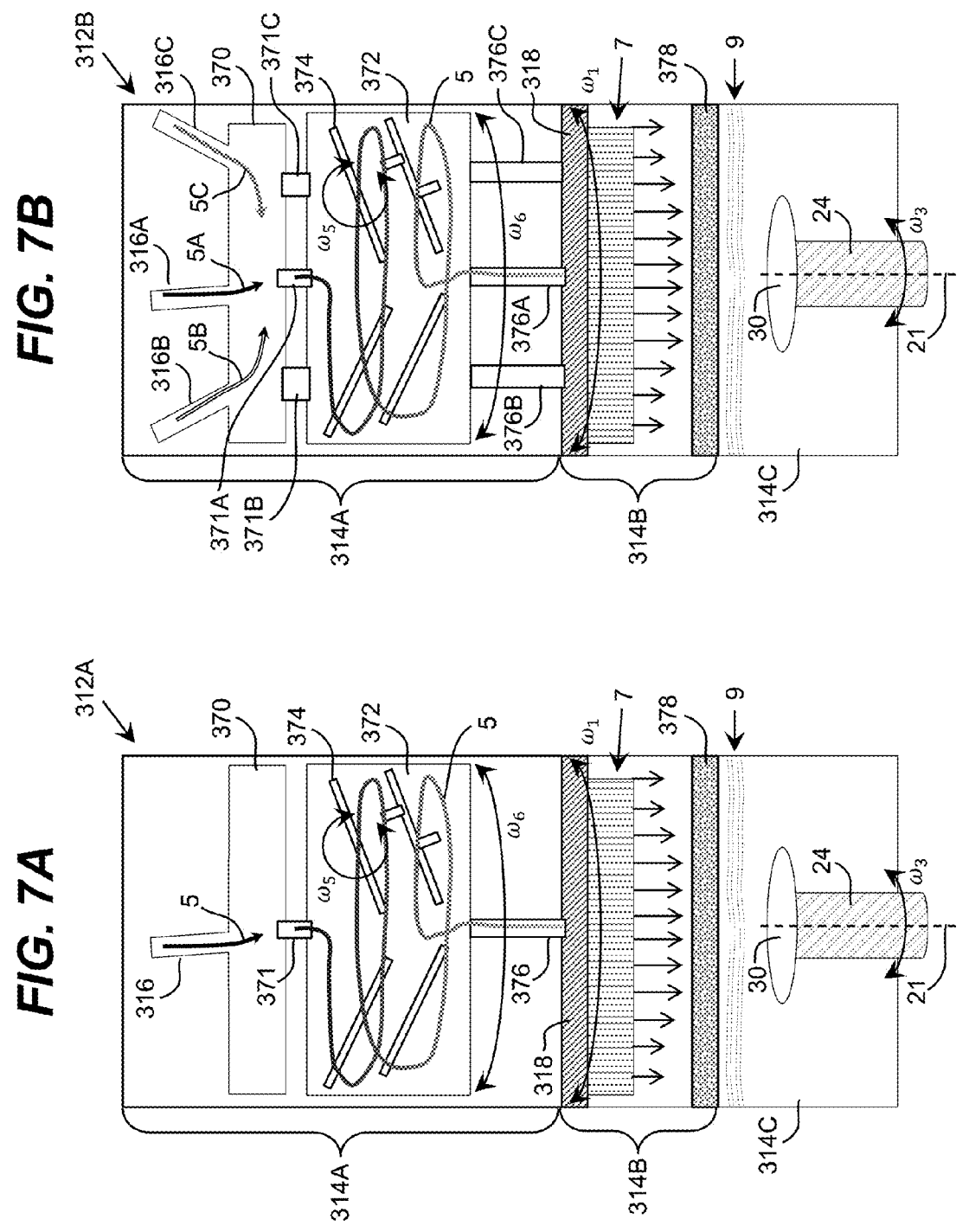

In an embodiment, a CVD reactor 12 can include a CVD chamber 14 including multiple sections. To this extent, FIGS. 7A-7B show schematics of illustrative CVD reactors 312A, 312B according to embodiments. In each case, the CVD reactor 312A, 312B can be implemented as part of a CVD system 10 (FIG. 4), e.g., in the same manner as discussed herein with respect to the CVD reactors 12, 112 (FIGS. 4, 5A-5B). The CVD reactors 312A, 312B are shown including a chamber having three sections 314A-314C. While three sections 314A-314C are shown, it is understood that the chamber can include any number of two or more sections 314A-314C.

Regardless, the chamber section 314A can be configured for cold gas mixing. To this extent, the section 314A is shown including a gas injection component 316 through which one or more types of gases 5 can be selectively injected into a first enclosure 370, where the gas(es) 5 can be premixed. In an embodiment, a temperature within the section 314A is maintained at a level that prevents premature reaction of the gas(es) 5 present therein. For example, in an embodiment, the temperature within the section 314A is maintained at a temperature less than approximately 100 degrees Celsius. In a more particular embodiment, the temperature is approximately room temperature.

An outlet 371 (e.g., a valve, which can be selectively opened and closed by the control system 40 (FIG. 4)) can fluidly connect the enclosure 370 to a second enclosure 372 located within the section 314A. Gas(es) 5 can pass from the enclosure 370 through the outlet 371 and into the second enclosure 372, where the premixed gas(es) 5 can be further mixed. For example, the second enclosure 372 can include a set of mixing elements 374, which can be configured to improve mixing of the gas(es) 5. The mixing elements 374 can include one or more of various types of mixing elements 374 including, for example, a fin, a blade, a twisted section, and/or the like. Embodiments of the second enclosure 372 can include: a single mixing element 374; multiple mixing elements 374 of the same type; one or more of each of multiple mixing element types; and/or the like. In an embodiment, one or more of the mixing element(s) 374 can be rotated about an axis (e.g., a central axis, and/or the like, which is perpendicular to the plane of the drawing) at an angular speed $\omega_5$.

Additionally, the second enclosure 372 can be rotated at an angular speed $\omega_6$. Such rotation can be configured to further promote mixing the gases 5 present therein. For example, one or more of the mixing elements 374 can be attached to a wall of the second enclosure 372 and rotate therewith. It is understood that embodiments of the first section 314A can include only one of the second enclosure 372 or the mixing element(s) 374 which can be rotated about an axis. Regardless, upon exiting the second enclosure 372 through an outlet 376, the gases 5 can be well premixed.

The gas 5 can exit the outlet 376 and enter a second chamber section 314B configured to promote a uniform flow of the gas 5. Initially, the gas 5 can enter a gas injection component (e.g., showerhead) 318. The gas injection component 318 can be configured to operate in a manner similar to that described herein in conjunction with the gas injection components 18, 118 (FIGS. 4 and 5A-5C). To this extent, the gas injection component 318 can be rotated around an axis at an angular speed $\omega_1$ as described herein. A flow of mixed gases 7 can exit the gas injection component 318. In an embodiment, the second section 314B can be configured similar to a chamber described in conjunction with FIGS. 4 and 5A-5C. In this case, the second section 314B can include a bell unit configured similar to a bell unit 20, 120 and a second gas injection component configured similar to the second gas injection component 22, 122 described herein. However, as illustrated, an embodiment of the second section 314B can be implemented without these components.

The distribution of gases 7 may contain some non-uniformity in lateral velocity distribution, e.g., due to non-uniformly distributed pressure within the gas injection component 318. To further improve the uniformity of the gases 7, an embodiment of the section 314B can include a porous membrane 378, which can be configured to provide a highly uniform flow of gases 9 entering a third chamber section 314C. The porous membrane 378 can comprise any suitable membrane. In an embodiment, the porous membrane 378 comprises a highly chemically inert membrane having a high melting temperature. In a more particular embodiment, the porous membrane 378 is formed of porous titanium.

In the third section 314C, the gases 9 are delivered in a downstream direction toward a substrate wafer 30 located on a substrate holder 24, which can be configured as described herein, e.g., rotatable about an axis 21 (or off-axis) at an angular speed $\omega_3$. The gases 9 can include a set of precursor gases for epitaxial growth on the substrate wafer 30. As described herein, the first section 314A can be maintained at a low temperature, e.g., using a liquid (e.g., water) cooling solution and isolation from the second section 314B. In contrast, the second and third sections 314B, 314C can be configured to withstand high temperatures, e.g., by proper water cooling. For example, typical growth temperatures can be within a range of 300 to 1400 degrees Celsius. To this extent, the material selection, temperature control, and/or the like, can be the same as other embodiments described herein.

It is understood that various alternative configurations of a multi-section chamber CVD reactor 312A can be implemented. For example, as shown in FIG. 7B, a CVD reactor 312B is shown including multiple gas injection components 316A-316C through which one or more types of gases 5A-5C can be selectively injected into the first enclosure 370. In this case, each gas injection component 316A-316C can be used to introduce a different type of gas 5A-5C into the first enclosure 370. To this extent, two or more gases 5A-5C can be concurrently introduced into the first enclosure 370 as opposed to using a serial introduction approach using the CVD reactor 312A. While three gas injection components 316A-316C are shown, it is understood that any number of two or more gas injection components 316A-316C can be implemented. Furthermore, the gas injection components 316A-316C can be independently operated (e.g., by a control system 40) to allow for none, only a subset, or all of the gas injection components 316A-316C to be selectively utilized at any given time.

The gas injection components 316A-316C can be utilized to introduce any combination of various gases into the enclosure 370 for premixing. In an embodiment, the gases can include $N_2$ and mixtures of $H_2$ and/or other gases, such as a mixture of $H_2$ and $NH_3$. In an illustrative application, the gas injection components 316A-316C introduce: $NH_3$; metalorganic precursors; and a hydrogen gas. However, it is understood that this combination of gases is only illustrative of various possible combinations.

Additionally, the CVD reactor 312B is shown including multiple outlets 371A-371C for the gas 5 to flow from the first enclosure 370 to the second enclosure 372, as well as multiple outlets 376A-376C for the gas 5 to flow from the second enclosure 372 to the gas injection component 318. While the CVD reactor 312B is shown including multiple of each type of outlet, it is understood that only one of the types of outlets can include multiple outlets. Furthermore, while the CVD reactor 312B is shown including three of each type of outlet 371A-371C, 376A-376C, it is understood that any number of one or more of each type of outlet 371A-371C, 376A-376C can be implemented. Regardless, the outlets for each type of outlet 371A-371C, 376A-376C can be separately opened and closed and/or opened and closed as a group by the control system 40.

In an embodiment, the multiple outlets 371A-371C are implemented when the second enclosure 372 does not rotate (e.g., only the mixing elements 374 rotate). Similarly, the multiple outlets 376A-376C can be implemented when the second enclosure 372 and the gas injection component 318 rotate at the same angular velocity ($\omega_1 = \omega_6$), which can include embodiments where neither component rotates. However, in an embodiment, multiple outlets 371A-371C and/or multiple outlets 376A-376C are implemented when the second enclosure 372 can be rotated having a distinct angular velocity $\omega_6$ from that of the first enclosure 370 and/or the gas injection component 318.

FIGS. 8A-8C show illustrative configurations of separately rotatable structures 402, 404 according to embodiments. For example, the structure 402 can correspond to the second enclosure 372 (FIG. 7B) while the structure 404 can correspond to the gas injection component 318 (FIG. 7B). However, it is understood that while the structures 402, 404 are described as being separately rotatable, either structure 402, 404 may be not rotatable and/or not rotated at times during use.

As shown in FIG. 8A, the two structures 402, 404 can be located immediately adjacent to one another. The first structure 402 can include a bottom surface 406, which includes a set of openings 406A, while the second structure 404 can include a top surface 408 with a set of openings 408A. As illustrated in FIG. 8B, one of the structures, such as the structure 404, can be larger than the other structure 402, and configured such that a portion of the smaller structure 402 protrudes into the larger structure 404.

As illustrated most clearly in FIG. 8C, the sets of openings 406A, 408A can be sized and located such that during rotation of either or both of the structures 402, 404, an opening in the set of openings 406A will periodically at least partially align with an opening the set of openings 408A and periodically be misaligned with any opening in the set of openings 408A. In this manner, the sets of openings 406A, 408A can provide a set of fluid connections between the structures 402, 404, which are pulsed on and off and can be positioned in different locations along the surfaces 406, 408 during rotation of one or both of the structures 402, 404, thereby resulting in a varying outflow area for gas flowing from the first structure 402 into the second structure 404.

The varying outflow area can affect the gas flow dynamics as the gas passes from the first structure 402 to the second structure 404. For example, the varying outflow area can have a beneficial effect on gas stabilization. To this extent, in an embodiment, the sets of openings 406A, 408A are configured such that the sets of openings 406A, 408A are completely misaligned in a first position, and substantially aligned in a second position. During a time period that the sets of openings 406A, 408A are completely misaligned, a pressure within the first structure 402 can stabilize and become uniform throughout the interior of the first structure 402. To further improve a uniformity of the pressure within the first structure 402, an inflow channel 410 also can be closed when the sets of openings 406A, 408A are completely misaligned. Closing the inflow channel 410 can be implemented using any solution, including closing a valve, a diaphragm, a tap, and/or the like, or with similarly configured sets of openings at an interface between the first structure 402 and another structure. In an illustrative embodiment, at least one of the structures, such as the structure 402, is fabricated of two distinct components, e.g., a top component 402A and an bottom component 402B. In this case, the top component 402A can comprise a structure that remains stationary but is rotatably connected to the bottom component 402B, which can be rotated (e.g., to selectively align the sets of openings). The components 402A, 402B can be rotatably connected such that no gas leaks between the components 402A, 402B using any solution.

Returning to FIGS. 7A and 7B, an embodiment of a process for operating the CVD reactor 312A, 312B, which can be implemented by a control system 40, can include: filling the second enclosure 372 with gas(es) 5; closing the outlet(s) 371 to the second enclosure 372; mixing the gas(es) within the second enclosure 372; equalizing pressure within the second enclosure 372 by not flowing any gas(es) 5 into or out of the second enclosure 372; and opening the outlet(s) 376 from the second enclosure 372 to the gas injection component 318, thereby resulting in a substantially uniform outflow of the gas(es) 5 from the second enclosure 372 to the gas injection component 318 through each outlet 376 connecting the structures 372, 318.

It is understood that the CVD reactor 312A, 312B can be operated using any of various alternative processes. For example, in an embodiment, the second enclosure 372 can remain fixed (e.g., not rotated) throughout the process. Subsequently, the gas injection component 318 can be rotated, e.g., to align and misalign sets of holes in the adjacent surfaces of the structures 372, 318 as described herein. The rotation of the gas injection component 318 can include alternating directions of rotation, in which the gas injection component 318 first rotates discretely by a prescribed angle in a first direction, and then returns to the previous orientation by counter-rotating discretely by the same prescribed angle. In this case, the sets of holes can be substantially aligned in a first orientation and misaligned in the second orientation.

Figure 9:
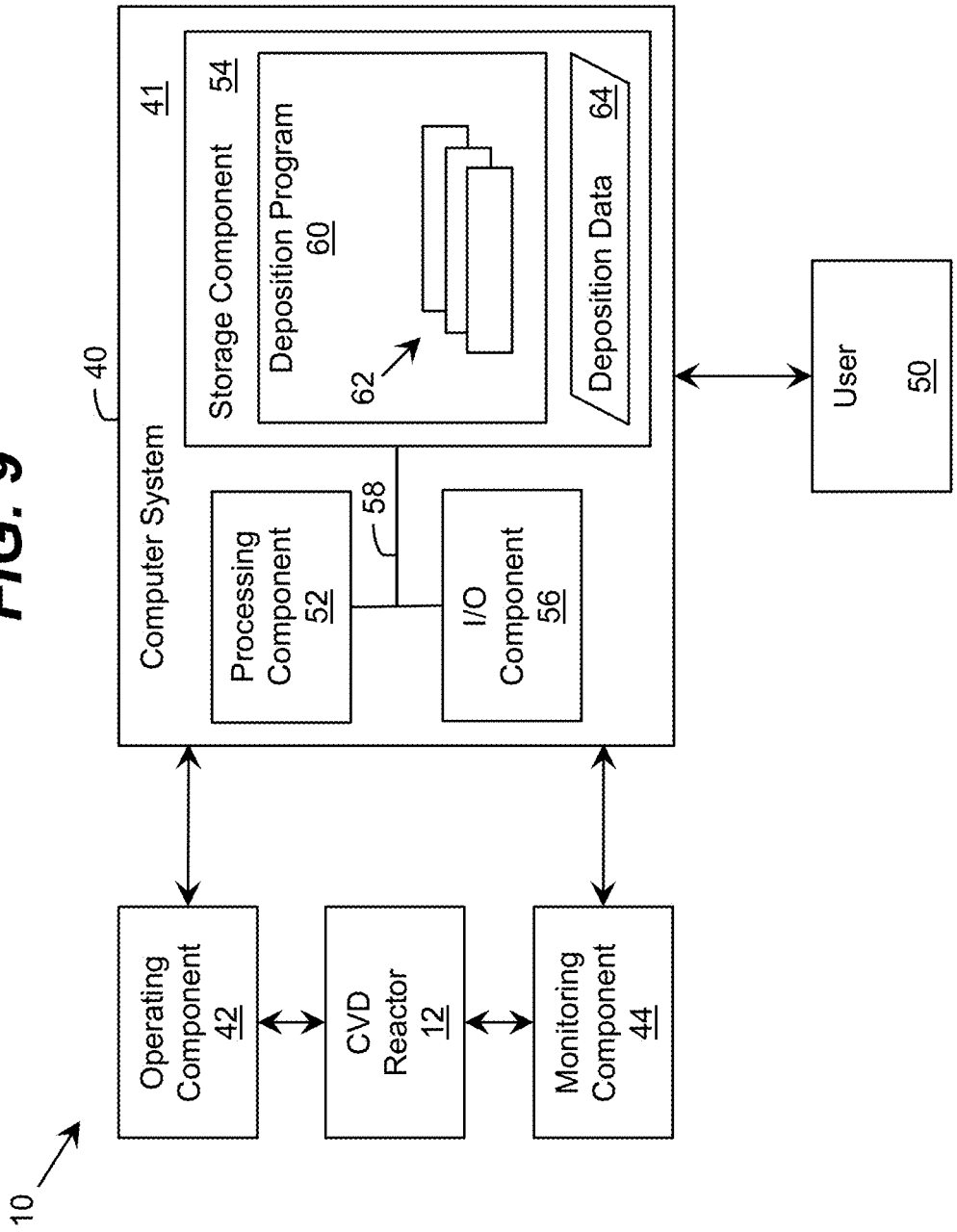
FIG. 9 shows a schematic representation of an illustrative computer system included in a CVD system according to an embodiment.

As discussed herein, the control system 40 can operate various devices in an operating component 42 and/or monitoring component 44 to implement a growth procedure within the CVD reactor 12 (FIG. 4). In an illustrative embodiment, the control system 40 is programmed to implement the growth procedure. To this extent, FIG. 9 shows a schematic representation of an illustrative control system 40 included in a CVD system 10 according to an embodiment. In this case, the control system 40 is shown implemented as a computer system 41 including a deposition program 60, which makes one or more computing devices included in the computer system 41 operable to implement a growth procedure using the CVD reactor 12 as described herein.

The computer system 41 is shown including a processing component 52 (e.g., one or more processors), a storage component 54 (e.g., a storage hierarchy), an input/output (I/O) component 56 (e.g., one or more I/O interfaces and/or devices such as those implemented in the operating component 42 and/or the monitoring component 44), and a communications pathway 58. In general, the processing component 52 executes program code, such as the deposition program 60, which is at least partially fixed in the storage component 54. While executing program code, the processing component 52 can process data, which can result in reading and/or writing transformed data from/to the storage component 54 and/or the I/O component 56 for further processing. The pathway 58 provides a communications link between each of the components in the computer system 41. The I/O component 56 can comprise one or more human I/O devices, which enable a human user 50 to interact with the computer system 41 and/or one or more communications devices to enable a system user 50 to communicate with the computer system 41 using any type of communications link. To this extent, the deposition program 60 can manage a set of interfaces (e.g., graphical user interface(s), application program interface, and/or the like) that enable human and/or system users 50 to interact with the deposition program 60. Furthermore, the deposition program 60 can manage (e.g., store, retrieve, create, manipulate, organize, present, etc.) the data, such as deposition data 64, using any solution.

In any event, the computer system 41 can comprise one or more general purpose computing articles of manufacture (e.g., computing devices) capable of executing program code, such as the deposition program 60, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, the deposition program 60 can be embodied as any combination of system software and/or application software.

Furthermore, the deposition program 60 can be implemented using a set of modules 62. In this case, a module 62 can enable the computer system 41 to perform a set of tasks used by the deposition program 60, and can be separately developed and/or implemented apart from other portions of the deposition program 60. As used herein, the term "component" means any configuration of hardware, with or without software, which implements the functionality described in conjunction therewith using any solution, while the term "module" means program code that enables a computer system 41 to implement the actions described in conjunction therewith using any solution. When fixed in a storage component 54 of a computer system 41 that includes a processing component 52, a module is a substantial portion of a component that implements the actions. Regardless, it is understood that two or more components, modules, and/or systems may share some/all of their respective hardware and/or software. Furthermore, it is understood that some of the functionality discussed herein may not be implemented or additional functionality may be included as part of the computer system 41.

When the computer system 41 comprises multiple computing devices, each computing device can have only a portion of the deposition program 60 fixed thereon (e.g., one or more modules 62). However, it is understood that the computer system 41 and the deposition program 60 are only representative of various possible equivalent computer systems that may perform a process described herein. To this extent, in other embodiments, the functionality provided by the computer system 41 and the deposition program 60 can be at least partially implemented by one or more computing devices that include any combination of general and/or specific purpose hardware with or without program code. In each embodiment, the hardware and program code, if included, can be created using standard engineering and programming techniques, respectively. In another embodiment, the control system 40 can be implemented without any computing device, e.g., using a closed loop circuit implementing a feedback control loop in which the outputs of one or more sensing devices are used as inputs to control the operation of one or more other devices (e.g., LEDs). Illustrative aspects of the invention are described in conjunction with the computer system 41. However, it is understood that the functionality described in conjunction therewith can be implemented by any type of monitoring and/or control system 40.

Regardless, when the computer system 41 includes multiple computing devices, the computing devices can communicate over any type of communications link. Furthermore, while performing a process described herein, the computer system 41 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

In an illustrative embodiment, the control system 40 implements a metalorganic chemical vapor deposition (MOCVD) growth procedure using the CVD reactor 12. MOCVD is a method of epitaxial growth of materials, especially semiconductors, from a surface reaction of metalorganics and metal hydrides containing the required chemical elements. However, it is understood that this is only illustrative of various types of rotating disk gas treatment procedures that can be implemented using the CVD reactor 12 as is understood to one of ordinary skill in the art. Regardless, an illustrative control system 40 can include a computer system 41 having a deposition program 60 stored thereon, which is configured to cause the computer system 41 to implement a growth procedure defined in deposition data 64. The growth procedure can be stored as deposition data 64 using any solution (e.g., one or more records in a database).

A growth procedure can define the use of various precursor gases, which are selected based on the elements to be grown for a given layer and/or a dopant to be included in the layer. In an illustrative embodiment, the growth procedure includes the growth of one or more group III nitride layers on a substrate wafer 30. In this case, illustrative precursor gases include: Tri Methyl Aluminum (TMA) for depositing aluminum; Tri Methyl Indium (TMI) for depositing indium; Tri Methyl Gallium (TMG) for depositing gallium; ammonia ($NH_3$) for depositing nitrogen; and/or the like, and illustrative substrate wafers 30 include sapphire, aluminum nitride (AlN), gallium nitride (GaN), AlGaN, lithium aluminate, silicon, and/or the like. A doping precursor gas can be selected based on the corresponding dopant using any solution. A particular precursor gas can be introduced into the CVD chamber 14 (FIG. 4) using a set of time dependent pulses of the gas delivered by the showerhead 18 (FIG. 4) and/or the second gas injection component 22 (FIG. 4), which can be defined in the growth procedure.

In an embodiment, one or more attributes, such as: a quantity, a timing, a duration, a shape, and/or the like, of each precursor gas pulse can be configured based on the corresponding element and/or a set of desired growth attributes, e.g., to control a lattice mismatch, a strain, and/or the like, within the film being grown. As used herein, it is understood that a shape of a pulse corresponding to the flow rate of the gas during the pulse where a rectangular pulse shape represents a substantially constant flow rate of the gas over the duration of the pulse and a non-rectangular pulse shape represents a varying flow rate of the gas during the pulse. In an embodiment, a non-rectangular pulse shape is selected based on a target migration rate for the corresponding precursor flux.

A set of precursor gas pulses for a particular element can be substantially identical in duration, shape, quantity, and/or the like, or can have one or more attributes that vary from one or more other precursor gas pulses in the set. Precursor gas pulses in a set of pulses can occur at regular time intervals or be spaced by different time intervals. Precursor gas pulses for two or more elements can occur concurrently, partially overlap, sequentially, and/or the like, and can have similar attributes or differ by one or more attributes. Furthermore, a growth process can include one or more time periods during which no precursor gases are being introduced into the CVD chamber 14. In a more particular illustrative embodiment, the control system 40 implements a MOCVD growth process as described in U.S. Pat. No. 7,192,849, which is hereby incorporated by reference.

In addition to defining a set of precursor gas pulses, the growth procedure also can define one or more additional attributes of the growth environment within the CVD chamber 14. For example, illustrative attributes include: a temperature; a pressure; illumination attributes (e.g., illuminating the substrate wafer 30 with ultraviolet radiation during growth of a nitride-based film); and/or the like. For a growth procedure, one or more of these attributes can remain constant for a duration of the entire growth procedure or vary during the growth procedure. Similarly, a growth procedure can be configured to grow one or more layers of a material to any target thickness. In an embodiment, the growth procedure includes the growth of one or more layers having a thickness of at least fifteen nanometers.

While shown and described herein as a method and system for manufacturing semiconductors, it is understood that aspects of the invention further provide various alternative embodiments. For example, in one embodiment, the invention provides a computer program fixed in at least one computer-readable medium, which when executed, enables a computer system to manufacture a semiconductor using a process described herein. To this extent, the computer-readable medium includes program code, such as the deposition program 60 (FIG. 9), which enables a computer system to implement some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, such as the deposition program 60 (FIG. 9), which enables a computer system to implement some or all of a process described herein. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of the program code, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for manufacturing semiconductors. In this case, the generating can include configuring a computer system, such as the computer system 40 (FIG. 9), to implement a method of manufacturing semiconductors using a process described herein. The configuring can include obtaining (e.g., creating, maintaining, purchasing, modifying, using, making available, etc.) one or more hardware components, with or without one or more software modules, and setting up the components and/or modules to implement a process described herein. To this extent, the configuring can include deploying one or more components to the computer system, which can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A system comprising:
a chemical vapor deposition reactor including:
a chemical vapor deposition chamber;
a set of substrate holders located in the chemical vapor deposition chamber, wherein a substrate holder in the set of substrate holders is configured to be rotated about an axis of the substrate holder at a first angular speed; and
a set of gas injection components located in the chemical vapor deposition chamber, wherein a gas injection component in the set of gas injection components is configured to be rotated about an axis of the gas injection component at a second angular speed, wherein the first angular speed and the second angular speed are independently selectable; and
a control system, wherein the control system is configured to cause the substrate holder to rotate at the first angular speed and the gas injection component to rotate at the second angular speed, and wherein the control system is configured to vary at least one of the first angular speed or the second angular speed during a growth procedure.

2. The system of claim 1, wherein the chemical vapor deposition chamber further includes a cold gas mixing section including an enclosure configured to premix a set of gases present therein at a temperature less than one hundred degrees Celsius.

3. The system of claim 2, wherein the enclosure includes a plurality of mixing elements located in an interior of the enclosure, wherein at least one of: the enclosure or a mixing element in the plurality of mixing elements is configured to rotate at a third angular speed independently selectable from the first and second angular speeds.

4. The system of claim 1, further comprising a monitoring component configured to provide data corresponding to a substrate wafer located on the substrate holder for used by the control system, wherein the control system varies at least one attribute of a growth environment in the chemical vapor deposition chamber based on the data.

5. The system of claim 1, further comprising a porous membrane located between the set of substrate holders and the set of gas injection components.

6. The system of claim 1, wherein at least one of: the substrate holder or the gas injection component is configured to move in a direction towards or away from the other of the at least one of: the substrate holder or the gas injection component.

7. The system of claim 1, wherein the set of gas injection components includes a second gas injection component configured to be rotated about an axis of the second gas injection component at a third angular speed, and wherein the second angular speed and the third angular speed are independently selectable.

8. The system of claim 7, wherein one of the substrate holder, the gas injection component, and the second gas injection component is capable of rotating in a direction different from the others of the substrate holder, the gas injection component, and the second gas injection component.

9. The system of claim 1, wherein the gas injection component includes:
a showerhead; and
a bell unit extending from the showerhead, wherein the showerhead and the bell unit are configured to be concurrently rotated at independently selectable angular speeds.

10. The system of claim 1, wherein the substrate holder includes means for attaching a substrate wafer to a surface of the substrate holder using vacuum suction.

11. The system of claim 10, wherein the means includes:
a set of cavities located on the surface of the substrate holder;
a pump fluidly connected to the set of cavities; and
a pressure sensor located on the surface of the substrate holder, wherein the pump is configured to depressurize the set of cavities when the substrate wafer is located on the surface of the substrate holder to maintain a pressure detected by the pressure sensor at a target pressure.

12. A system comprising:
chemical vapor deposition reactor including:
a chemical vapor deposition chamber;
a plurality of substrate holders located in the chemical vapor deposition chamber, wherein a substrate holder in the plurality of substrate holders is configured to be rotated about an axis of the substrate holder at a first angular speed; and
a set of gas injection components located in the chemical vapor deposition chamber, wherein a gas injection component in the set of gas injection components is configured to be rotated about an axis of the gas injection component at a second angular speed, wherein the first angular speed and the second angular speed are independently selectable; and
a control system, wherein the control system is configured to cause the substrate holder to rotate at the first angular speed and the gas injection component to concurrently rotate at the second angular speed; and wherein another substrate holder in the plurality of substrate holders is configured to be rotated about an axis of the another substrate holder at a third angular speed, wherein the third angular speed is independently selectable from the first and second angular speeds.

13. The system of claim 12, further comprising a porous membrane located between the plurality of substrate holders and the set of gas injection components.

14. The system of claim 12, wherein the chemical vapor deposition chamber further includes a cold gas mixing section including an enclosure configured to premix a set of gases present therein at a temperature less than one hundred degrees Celsius.

15. The system of claim 12, wherein each of the plurality of substrate holders is configured to move a surface of a substrate wafer located on the substrate holder in a direction towards or away from the set of gas injection components.

16. The system of claim 12, wherein the set of gas injection components includes a second gas injection component configured to be rotated about an axis of the second gas injection component at a fourth angular speed, and wherein the second angular speed and the fourth angular speed are independently selectable.

17. A method comprising:

growing a layer on a surface of a substrate wafer in a chemical vapor deposition chamber, wherein the growing includes:

rotating, by a control system, a substrate holder on which the substrate wafer is attached about an axis of the substrate holder at a first angular speed; and concurrently rotating, by the control system, a gas injection component located in the chemical vapor deposition chamber about an axis of the gas injection component at a second angular speed, wherein the first angular speed and the second angular speed are independently selected; and wherein the growing includes varying at least one of the first angular speed or the second angular speed to deliver pulsating rotational torques.

18. The method of claim 17, wherein the growing further includes:

premixing a set of gases at a temperature less than one hundred degrees Celsius; and delivering the premixed set of gases to the surface of the substrate using the gas injection component.

19. The system of claim 18, wherein the delivering includes:

delivering the premixed set of gases from a first enclosure to a second enclosure;

mixing the premixed set of gases in the second enclosure; and delivering the set of gases from the second enclosure to a gas injection component.

20. The method of claim 17, further comprising injecting a gas flow from the gas injection component, wherein the injecting includes pulsing a plurality of precursor gases from the gas injection component through a porous membrane located between the substrate holder and the gas injection component.

* * * * *